United States Patent
Lee et al.

(10) Patent No.: US 10,935,842 B2
(45) Date of Patent: Mar. 2, 2021

(54) NANOSTRUCTURE BASED DISPLAY DEVICES

(71) Applicant: Nanosys, Inc., Milpitas, CA (US)

(72) Inventors: Ernest Lee, Palo Alto, CA (US); Charles Hotz, San Rafael, CA (US); ZhongSheng Luo, San Jose, CA (US); Jason Hartlove, Los Altos, CA (US); Shihai Kan, San Jose, CA (US); Jian Chen, Saratoga, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 16/108,321

(22) Filed: Aug. 22, 2018

(65) Prior Publication Data
US 2019/0064592 A1 Feb. 28, 2019

Related U.S. Application Data

(60) Provisional application No. 62/550,384, filed on Aug. 25, 2017.

(51) Int. Cl.
*G02F 1/13357* (2006.01)
*G02F 1/1335* (2006.01)
*H01L 27/32* (2006.01)

(52) U.S. Cl.
CPC .. *G02F 1/133603* (2013.01); *G02F 1/133514* (2013.01); *G02F 1/133606* (2013.01);
(Continued)

(58) Field of Classification Search
CPC ......... G02F 1/133603; G02F 1/133514; G02F 1/133606; G02F 1/133617; G02F 2201/52; H01L 27/322; H01L 27/3216
See application file for complete search history.

(56) References Cited

U.S. PATENT DOCUMENTS 9,519,186 B2 * 12/2016 Lee .................. G02B 6/0051
349/112
2003/0117423 A1 6/2003 Brown Elliott et al.
(Continued)

FOREIGN PATENT DOCUMENTS

KR 101717654 B1 3/2017

OTHER PUBLICATIONS

International Search Report and Written Opinion of the International Searching Authority directed to International Patent Application No. PCT/US2018/047712, dated Nov. 6, 2018, 14 pages.

*Primary Examiner* — Kevin Quarterman
(74) *Attorney, Agent, or Firm* — Sterne, Kessler, Goldstein & Fox P.L.L.C.

(57) ABSTRACT

A display device includes a backlight unit having a light source and a liquid crystal display (LCD) module. The light source is configured to emit a primary light in a first wavelength region. The LCD module includes a pixel having a first, second, and third sub-pixels. The first sub-pixel includes a first emissive surface configured to emit a first light in a second wavelength region. The second sub-pixel includes a second emissive surface configured to emit a second light in a third wavelength region. The third sub-pixel includes a third emissive surface configured to emit a third light in the first wavelength region. The third luminance is greater than the first luminance and the second luminance. An area of the third emissive surface is smaller than an area of the first emissive surface and an area of the second emissive surface.

44 Claims, 6 Drawing Sheets

(52) U.S. Cl.
CPC ...... *G02F 1/133617* (2013.01); *H01L 27/322* (2013.01); *H01L 27/3216* (2013.01); *G02F 2201/52* (2013.01)

(56) References Cited

U.S. PATENT DOCUMENTS

| | | | |
|---|---|---|---|
| 2006/0261732 | A1 | 11/2006 | Miller et al. |
| 2009/0295283 | A1* | 12/2009 | Kim ................. H01L 27/322 313/504 |
| 2011/0042697 | A1 | 2/2011 | Lee et al. |
| 2012/0326954 | A1* | 12/2012 | Itsumi ................ G02F 1/1368 345/92 |
| 2013/0161595 | A1 | 6/2013 | Kim et al. |
| 2015/0277188 | A1* | 10/2015 | He ..................... G09G 3/3648 349/43 |
| 2015/0346554 | A1* | 12/2015 | Lee ................. G02F 1/133617 349/69 |
| 2016/0091641 | A1 | 3/2016 | Tseng et al. |
| 2016/0116646 | A1* | 4/2016 | Araki .............. G02F 1/133377 349/69 |
| 2016/0133675 | A1 | 5/2016 | Yata et al. |
| 2017/0205666 | A1* | 7/2017 | Suh ................. G02F 1/133617 |
| 2017/0343859 | A1* | 11/2017 | Chen ............... G02F 1/133504 |
| 2018/0129098 | A1* | 5/2018 | Yoon .................... G02B 5/201 |
| 2018/0188579 | A1* | 7/2018 | Jeong ............. G02F 1/133602 |

* cited by examiner

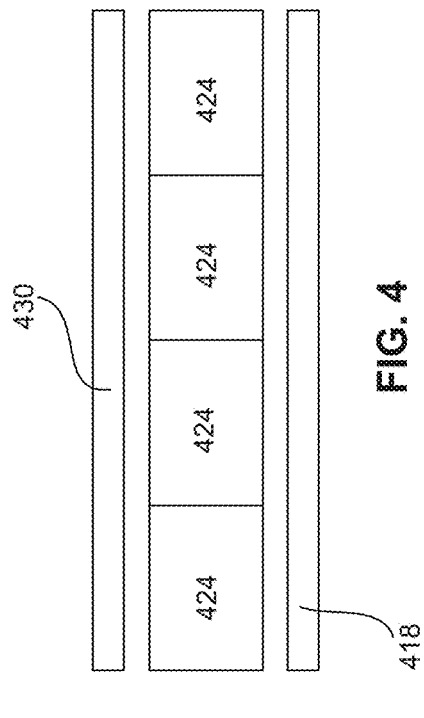
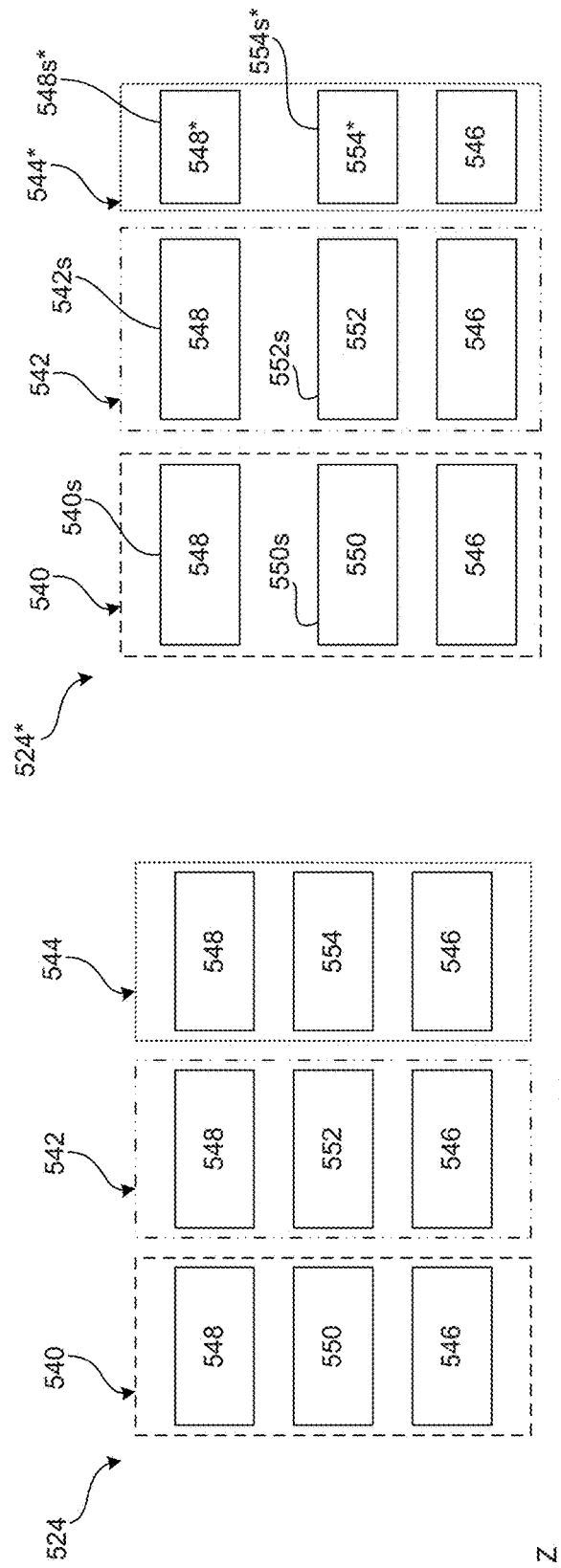

NANOSTRUCTURE BASED DISPLAY DEVICES

CROSS REFERENCE TO RELATED APPLICATIONS

This application incorporates by reference in their entirety U.S. Provisional Appl. No. 62/550,384, filed Aug. 25, 2017.

BACKGROUND OF THE INVENTION

Field

The present invention relates to display devices including phosphor films having luminescent nanostructures such as quantum dots (QDs).

Background

Luminescent nanostructures (NSs) such as quantum dots (QDs) represent a class of phosphors that have the ability to emit light at a single spectral peak with narrow line width, creating highly saturated colors. It is possible to tune the emission wavelength based on the size of the NSs. The NSs are used to produce a NS film. That may be used as a color down conversion layer in display devices (e.g., liquid crystal display (LCD) device, organic light emitting diode (OLED) display device). The use of a color down conversion layer in emissive displays can improve the system efficiency by down-converting white light, blue light, or ultra-violet (UV) light to a more reddish light, greenish light, or both before the light passes through a color filter. This use of a color down conversion layer may reduce loss of light energy due to filtering.

NSs may be used as the conversion material due to their broad absorption and narrow emission spectra. Because, the density of NSs required for such application is very high in a very thin color down conversion layer of about 3 µm-6 µm, NSs prepared using current methods suffer from quenching of their optical properties when the NSs are closely packed next to each other in a thin NS film. As such, current NS-based display devices using NS films as color down conversion layers suffer from low quantum yield (QY).

One of the factors used to define the image quality of a display device is the color gamut coverage of standard RGB color spaces such as Rec. 2020, Rec. 709, DCI P3, NTSC, or sRGB provided by the display device. FIG. 1 illustrates a definition of color gamut coverage of a display device. In FIG. 1, area 101 formed between 1976 CIE color coordinates 101a-101c represents the color gamut of a standard RGB color space (e.g., Rec. 2020) on the 1976 CIE u'-v' chromaticity diagram 100. Area 102 formed between 1976 CIE color coordinates 102a-102c represents the color gamut of the display device on the 1976 CIE u'-v' chromaticity diagram 100. Color gamut coverage of the display device may be defined as a ratio of the overlapping area 103 between areas 101 and 102 to area 101. The wider the color gamut coverage of a display device, the wider is the range of colors identifiable by the human eye (i.e., the visible spectrum) rendered by the display device, and hence, improves the image quality of the display device assuming the other factors contributing to the image quality are optimized.

Current display devices suffer from a trade-off between achieving the desired brightness (e.g., brightness required by high dynamic range (HDR) imaging standards) and the desired color gamut coverage (e.g., greater than 85%) of the standard RGB color spaces. For example, some display devices suffer about 30% loss in brightness to achieve over 90% DCI P3 color gamut coverage. Hence, with current technology, loss of brightness in display devices would be significantly higher in order to achieve color gamut coverage of color spaces that are even wider than DCI P3 (e.g., Rec. 2020).

Another disadvantage suffered by current display devices is the leakage of unconverted light through conversion materials (e.g., NS films) of the display devices that negatively affects the color gamut coverage of the display devices. For example, some display devices suffer from leakage of unwanted blue light through their green and/or red pixels. This may occur when blue light incident on the conversion material from a blue light source is not fully absorbed and converted into green and/or red light by the conversion material.

SUMMARY

Accordingly, there is need for display devices with improved color gamut coverage and with less of a trade-off between achieving the desired color gamut coverage of the wide RGB color spaces and the desired brightness.

According to an embodiment, a display device includes a backlight unit having a light source and a liquid crystal display (LCD) module. The light source is configured to emit a primary light in a first wavelength region of an electromagnetic (EM) spectrum. The LCD module includes a pixel having first, second, and third sub-pixels. The first sub-pixel includes a first emissive surface configured to emit a first light, having a first amount of total luminance, in a second wavelength region of the EM spectrum. The second sub-pixel includes a second emissive surface configured to emit a second light, having a second amount of total luminance, in a third wavelength region of the EM spectrum. The third sub-pixel includes a third emissive surface configured to emit a third light, having a third amount of total luminance, in the first wavelength region of the EM spectrum. The first, second, and third wavelength regions are different from each other. The third luminance is greater than the first luminance and the second luminance. An area of the third emissive surface is smaller than an area of the first emissive surface and an area of the second emissive surface.

According to an embodiment, a display device includes first, second, and third sub-pixels. The first sub-pixel includes a first emissive surface configured to emit a first light, having a first amount of total luminance, in a first wavelength region of the EM spectrum. The second sub-pixel includes a second emissive surface configured to emit a second light, having a second amount of total luminance, in a second wavelength region of the EM spectrum. The third sub-pixel includes a third emissive surface configured to emit a third light, having a third amount of total luminance, in a third wavelength region of the EM spectrum. The first, second, and third wavelength regions are different from each other. The third luminance is greater than the first luminance and the second luminance. An area of the third emissive surface is smaller than an area of the first emissive surface and an area of the second emissive surface.

According to an embodiment, a display device includes first, second, and third emissive surfaces. The first emissive surface configured to emit a first light, having a first amount of total luminance, in a first wavelength region of the EM spectrum. The second emissive surface configured to emit a second light, having a second amount of total luminance, in a second wavelength region of the EM spectrum. The third emissive surface configured to emit a third light, having a third amount of total luminance, in a third wavelength region of the EM spectrum. The first, second, and third wavelength regions are different from each other. The third luminance is greater than the first luminance and the second luminance. An area of the third emissive surface is smaller than an area of the first emissive surface and an area of the second emissive surface.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments and, together with the description, further serve to explain the principles of the present embodiments and to enable a person skilled in the relevant art(s) to make and use the present embodiments.

FIG. 1 is a CIE 1976 u'v' chromaticity diagram of Rec. 2020 color gamut and a color gamut of a display device.

FIGS. 2A, 2B, and 3 are exploded cross-sectional views of liquid crystal display (LCD) devices, according to an embodiment.

FIG. 4 is an exploded cross-sectional view of an organic light emitting diode (OLED) display device, according to an embodiment.

FIGS. 5A and 5B are exploded cross-sectional views of pixels of an OLED display device, according to an embodiment.

Figure 1:
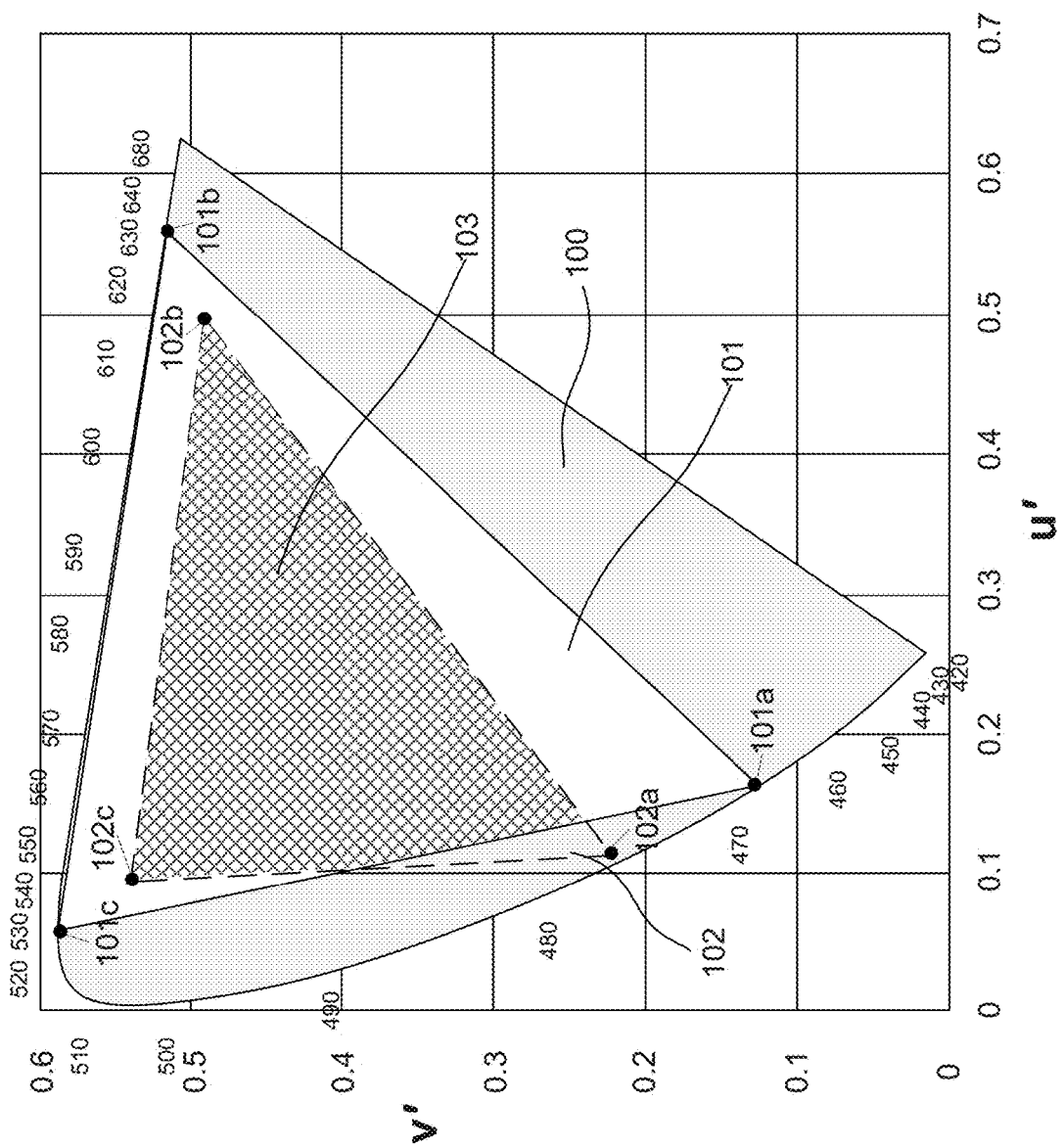

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

In embodiments, the term "display device" refers to an arrangement of elements that allow for the visible representation of data on a display screen. Suitable display screens may include various flat, curved or otherwise-shaped screens, films, sheets or other structures for displaying information visually to a user. Display devices described herein may be included in, for example, display systems encompassing a liquid crystal display (LCD), televisions, computers, mobile phones, smart phones, personal digital assistants (PDAs), gaming devices, electronic reading devices, digital cameras, tablets, wearable devices, car navigation systems, and the like.

The term "about" as used herein indicates the value of a given quantity varies by ±10% of the value. For example, "about 100 nm" encompasses a range of sizes from 90 nm to 110 nm, inclusive.

The term "substantially" as used herein indicates the value of a given quantity varies by ±1% to ±5% of the value.

In embodiments, the term "forming a reaction mixture" or "forming a mixture" refers to combining at least two components in a container under conditions suitable for the components to react with one another and form a third component.

In embodiment, the terms "light guide plate," "light guide," and "light guide panel" are used interchangeably and refer to an optical component that is suitable for directing electromagnetic radiation (light) from one position to another.

In embodiments, the term "optically coupled" means that components are positioned such that light is able to pass from one component to another component without substantial interference.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The terms "luminance" and "brightness" are used herein interchangeably and refer to a photometric measure of a luminous intensity per unit area of a light source or an illuminated surface.

The term "radiance" as used herein refers to a radiometric measure of a radiant intensity per unit area of a light source or an illuminated surface.

The terms "specular reflectors," "specularly reflective surfaces," and "reflective surfaces" are used herein to refer to elements, materials, and/or surfaces capable of specular reflection.

The term "specular reflection" is used herein to refer to a mirror-like reflection of light (or of other kinds of wave) from a surface, when an incident light hits the surface.

The term "nanostructure (NS) film" is used herein to refer to a film having luminescent nanostructures.

The term "red sub-pixel" is used herein to refer to an area of a pixel that emits light having a primary emission peak wavelength in the red wavelength region of the visible spectrum. In some embodiments, the red wavelength region may include wavelengths ranging from about 620 nm to about 750 nm.

The term "green sub-pixel" is used herein to refer to an area of a pixel that emits light having a primary emission peak wavelength in the green wavelength region of the visible spectrum. In some embodiments, the green wavelength region may include wavelengths ranging from about 495 nm to about 570 nm.

The term "blue sub-pixel" is used herein to refer to an area of a pixel that emits light having a primary emission peak wavelength in the blue wavelength region of the visible spectrum. In some embodiments, the blue wavelength region may include wavelengths ranging from about 435 nm to about 495 nm.

The term "emissive surface of a sub-pixel" is used herein to refer to a surface of a topmost layer of the sub-pixel from which light is emitted towards a display screen of a display device.

The term "luminance" is used herein to refer to a light intensity per unit area of an emissive surface.

The term "total luminance from a sub-pixel" is used herein to refer to a light intensity from per unit area of an emissive surface of the sub-pixel x total area of the emissive surface of the sub-pixel.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

Overview

This disclosure provides various embodiments of nanostructure-based display devices that help to improve or eliminate existing trade-offs between achieving the desired brightness and the desired color gamut in display devices. These various embodiments also help to improve display performance such as color gamut coverage of the nanostructure-based display devices by reducing or substantially eliminating leakage of unwanted light through one or more pixels of the display devices.

Example Embodiments of a Liquid Crystal Display (LCD) Device

Figure 2A:
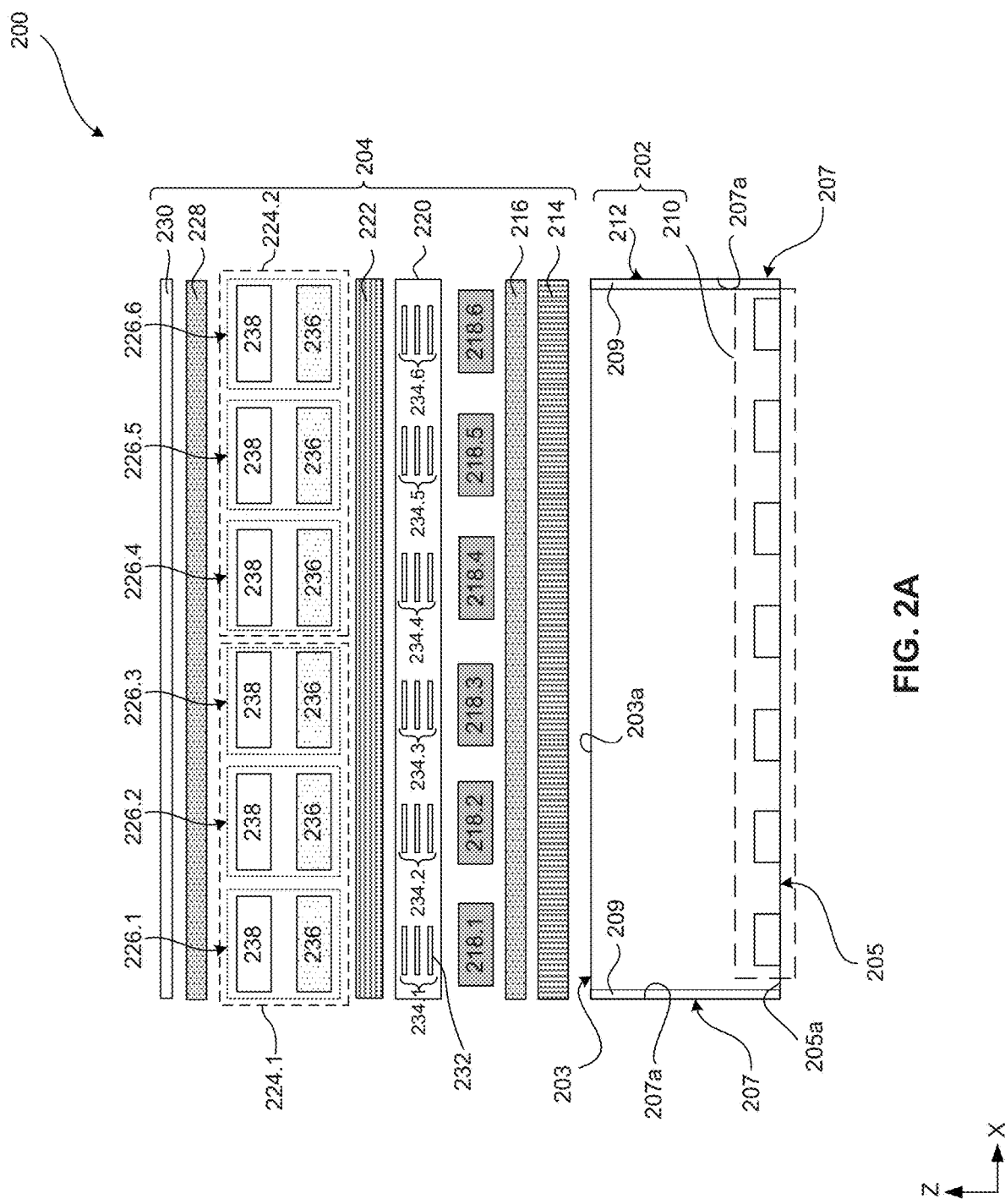

FIG. 2A illustrates a schematic of an exploded cross-sectional view of an LCD display device 200, according to an embodiment. A person of ordinary skill in the art will recognize that the view of display device in FIG. 2A is shown for illustration purposes and may not be drawn to scale. LCD display device 200 may include a backlight unit (BLU) 202 and an LCD module 204, according to an embodiment.

BLU 202 may include an optical cavity 212 and an array of LEDs 210 (e.g., white LEDs, blue LEDs, UV LEDs, or a combination thereof) coupled to optical cavity 212. Optical cavity 212 may include a top side 203, a bottom side 205, sidewalls 207, and a closed volume confined by top side 203, bottom side 205, and sidewalls 207. LEDs 210 may be coupled to a top surface 205a of bottom side 205 within the closed volume. LEDs 210 may be configured to provide a primary light (e.g., a UV light, a blue light, or a white light) that may be processed through LCD module 204 and subsequently, transmitted to and distributed across a display screen 230 of LCD display device 200. In some embodiments, LEDs 210 may comprise blue LEDs that emit in the range from about 440 nm to about 470 nm. In some embodiments, LEDs 210 may comprise white LEDs that emit in the range from about 440 nm to about 700 nm or other possible light wavelength ranges. In an embodiment, the array of LEDs 210 may comprise a two-dimensional array of LEDs that are spread across an area of top surface 205a and the area may be equal to the surface area of display screen 230.

It should be noted that even though two sidewalls 207 are shown in FIG. 2A, a person skilled in the art would understand that optical cavity 212 may include any number of sidewalls 207, according to various embodiments. For example, optical cavity 212 may have a cuboid shape and may include four sidewalls similar to sidewalls 207. Optical cavity 212 is not restricted to being cuboid in shape or having other straight-sided shapes. Optical cavity 212 may be configured to be any type of geometric shape, such as but not limited to cylindrical, trapezoidal, spherical, or elliptical, according to various embodiments, without departing from the spirit and scope of the present invention. It should also be noted that the rectangular cross-sectional shape of optical cavity 212, as illustrated in FIG. 2A, is for illustrative purposes, and is not limiting. Optical cavity 212 may have other cross-sectional shapes (e.g., trapezoid, oblong, rhomboid), according to various embodiments, without departing from the spirit and scope of the present invention.

Top side 203 of optical cavity 212 may be configured to be an optically diffusive and transmissive layer such that light from LEDs 210 may exit optical cavity 212 through top side 203 with a substantially uniform distribution of brightness across top surface 203a of top side 203. In an embodiment, top side 203 may include optically transparent areas and optically translucent areas that are strategically arranged over LEDs 210 to provide the substantially uniform distribution in light brightness exiting top side 203. In another embodiment, top side 203 may include pores of varying sizes in diameters and optically translucent areas that are strategically arranged to provide the substantially uniform distribution in light brightness exiting top side 203.

Bottom side 205 and/or sidewalls 207 may be constructed from one or more materials (e.g., metals, non-metals, and/or alloys) that are configured to have specularly reflective top surface 205a and/or specularly reflective side wall interior surfaces 207a, respectively. For example, top surface 205a and/or side wall interior surfaces 207a may be mirror-like surfaces having mirror-like reflection properties. In some embodiments, top surface 205a and/or side wall interior surfaces 207a may be completely specularly reflective or partially specularly reflective and partially scattering.

In alternate embodiments, optical cavity 212 may include specular reflectors 209 coupled to sidewall interior surfaces 207a. Specular reflectors 209 may be coupled to sidewall interior surfaces 207a using optically transparent adhesive. The optically transparent adhesive may comprise tape, various glues, polymeric compositions such as silicones, etc. Additional optically transparent adhesive may include various polymers, including, but not limited to, poly(vinyl butyral), poly(vinyl acetate), epoxies, and urethanes; silicone and derivatives of silicone, including, but not limited to, polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including, but not limited to, methylmethacrylate, butylmethacrylate, and laurylmethacrylate; styrene based polymers; and polymers that are cross linked with difunctional monomers, such as divinylbenzene, according to various examples.

Specularly reflective top surface 205a and side wall interior surfaces 207a and specular reflectors 209 may substantially minimize absorption of light from LEDs 210 through bottom side 205 and/or side walls 207 and thus, substantially minimize loss of luminance within optical cavity 212 and increase light output efficiency of BLU 202.

In alternate embodiments, BLU 202 may further include one or more brightness enhancement films (BEFs) (not shown) disposed between optical cavity 212 and LCD module 204. The one or more BEFs may have reflective and/or refractive films, reflective polarizer films, light extraction features, light recycling features, prism films, groove films, grooved prism films, prisms, pitches, grooves, or other suitable brightness enhancement features. The brightness-enhancing features of BEFs may be configured to reflect a portion of the primary light (e.g., blue or UV light from optical cavity 212) back toward optical cavity 212, thereby providing recycling of the primary light.

LCD module 204 may be configured to process the light received from BLU 202 to a desired characteristics for transmission to and distribution across display screen 230. In some embodiments, LCD module 204 may include one or more polarizing filters, such as first and second polarizing filters 214 and 222, one or more optically transparent substrates such as first and second optically transparent substrates 216 and 228, switching devices 218.1 through 218.6 arranged in a 2-D array on first substrate 216, a liquid crystal (LC) solution layer 220, a plurality of pixels such as pixels 224.1 and 224.2 arranged in a 2-D array, and display screen 230.

In some embodiments, pixel 224.1 may include sub-pixels 226.1 through 226.3 and pixel 224.2 may include sub-pixels 226.4 through 226.6. In some embodiments, each of pixels 224.1 and 224.2 may be tri-chromatic, for example, having red sub-pixels 226.1 and 226.4, green sub-pixels 226.2 and 226.5, and blue sub-pixels 226.3 and 226.6, respectively.

The term "red sub-pixel" is used herein to refer to an area of a pixel that emits light having a primary emission peak wavelength in the red wavelength region of the visible spectrum. In some embodiments, the red wavelength region may include wavelengths ranging from about 620 nm to about 750 nm. The term "green sub-pixel" is used herein to refer to an area of a pixel that emits light having a primary emission peak wavelength in the green wavelength region of the visible spectrum. In some embodiments, the green wavelength region may include wavelengths ranging from about 495 nm to about 570 nm. The term "blue sub-pixel" is used herein to refer to an area of a pixel that emits light having a primary emission peak wavelength in the blue wavelength region of the visible spectrum. In some embodiments, the blue wavelength region may include wavelengths ranging from about 435 nm to about 495 nm.

The arrangement order of red, green, and blue sub-pixels 226.1 through 226.6 in respective pixels 224.1 and 224.2 is illustrative and is not limiting. The red, green, and blue sub-pixels in each of pixels 224.1 and 224.2 may be arranged in any order with respect to each other. In some embodiments, pixels 224.1 and/or 224.2 may be monochromatic having either red, green, or blue sub-pixels 226.1 through 226.6. The number of pixels and switching devices shown in FIG. 1 are illustrative and are not limiting. LCD module 204 may have any number of switching devices and pixels without departing from the spirit and scope of this disclosure.

Light from BLU 202 may be polarized through first polarizing filter 214 and the polarized light may be transmitted to LC solution layer 220. LC solution layer 220 may include LCs 232 having rod-shaped molecules that may act as shutters to control the amount of light transmission from LC solution layer 220. In some embodiments, LCs 232 may be arranged in a 3-D array. Columns 234.1 through 234.6 of the 3-D array of LCs may be independently controlled by respective switching devices 218.1 through 218.6. In some embodiments, switching devices 218.1 through 218.6 may comprise transistors, such as, for example, thin film transistors (TFTs). By controlling LCs 232, the amount of light travelling from columns 234.1 through 234.6 to respective sub-pixels 226.1 through 226.6 may be controlled, and consequently, the amount of light transmitting from sub-pixels 226.1 through 226.6 is controlled.

LCs 232 may be twisted to varying degrees depending on the voltage applied to columns 234.1 through 234.6 by respective switching devices 218.1 through 218.6. By controlling the twisting of LCs 232, the polarization angle of light passing through LC solution layer 220 may be controlled. Light leaving LC solution layer 220 may then pass through second polarizing filter 222 that may be positioned at 90 degrees with respect to first polarizing filter 214. The angle of polarization of the light leaving LC solution layer 220 and entering second polarizing filter 222 may determine how much of the light is able to pass through and exit from second polarizing filter 222. Second polarizing filter 222 may attenuate the light, block the light, or allow the light to pass without attenuation based on its angle of polarization.

Portions of light travelling through columns 234.1 through 234.6 of LCs and exiting out of second polarizing filter 222 may then enter respective ones of sub-pixels 226.1 through 226.6. These portions of light may undergo a stage of color filtering through the respective ones of sub-pixels 226.1 through 226.6 to achieve the desired optical characteristics for light distribution across display screen 230. In some embodiments, each of sub-pixels 226.1 through 226.6 may include a phosphor film 236 that may filter the portions of light entering sub-pixels 226.1 through 226.6.

Phosphor films 236 may include luminescent nanostructures such as QDs (e.g., QD 600 described with reference to FIG. 6), according to some embodiments. Phosphor films 236 may be down-converters, where the portions of light (also referred as primary light) entering the respective ones of sub-pixels 226.1 through 226.6 may be absorbed, for example, by the luminescent nanostructures in phosphor films 236 and re-emitted as secondary light having a lower energy or longer wavelength than the primary light.

In some embodiments, phosphor films 236 of red sub-pixels 226.1 and 226.4 may include luminescent nanostructures that absorb the primary light and emit a first secondary light having a primary emission peak wavelength in the red wavelength region of the visible spectrum light. In some embodiments, phosphor films 236 of green sub-pixels 226.2 and 226.5 may include luminescent nanostructures that absorb the primary light and emit a second secondary light having a primary emission peak wavelength in the green wavelength region of the visible spectrum light.

In some embodiments, when BLU 202 has UV LEDs 210, phosphor films 236 of blue sub-pixels 226.3 and 226.6 may include luminescent nanostructures that absorb the primary light and emit a third secondary light having a primary emission peak wavelength in the blue wavelength region of the visible spectrum light.

In some embodiments, phosphor films 236 may be segmented films that are placed adjacent to each other on second polarizing filter 222 or on an optically transparent substrate (not shown). The segmented phosphor films 236 may be placed in a manner such that there is negligible gap at interfaces between adjacent phosphor films 236 to prevent leakage of primary light through the interfaces. In alternate embodiments, each of phosphor films 236 may be different regions of a continuous phosphor film.

Additionally, each of sub-pixels 226.1 through 226.6 may include a light blocking element 238 disposed on phosphor film 236, according to some embodiments. The secondary light emitting from phosphor films 236 may be filtered through corresponding ones of light blocking elements 238 before travelling to display screen 230.

Light blocking elements 238 may be configured to allow the secondary light (e.g., first, second, and/or third secondary light discussed above) to pass and to block portions of the primary light (e.g., blue light or UV light) that are not absorbed by phosphor films 236 and down-converted to the secondary light. The unwanted portions of primary light that may have leaked out of phosphor films 236 may be blocked by absorbing and/or scattering them. Leakage of the unconverted primary light from phosphor films 236 to display screen 230 may adversely affect the color gamut coverage of LCD display device 200. The use of light blocking elements 238 to prevent such leakage may also help to reduce the manufacturing cost of LCD display device 200 by reducing the density of luminescent nanostructures included in phosphor films 236. The density of luminescent nanostructures may be reduced as instead of using the luminescent nanostructures to absorb substantially all portions of the primary light, any portions of primary light not absorbed in phosphor films 236 may be filtered out by light blocking elements 238.

Light blocking elements 238 may be also configured to tune the spectral emission widths (also referred as width of emission spectrum) of the secondary light (e.g., first, second, and/or third secondary light discussed above) to achieve a desired color gamut coverage of LCD display device 200. Tuning of the spectral emission widths may require absorbing one or more wavelengths from the secondary light to narrow their spectral emission widths to achieve the desired color gamut coverage without significant decrease in brightness. For example, there may be less than 10% (e.g., about 8%, about 5%, about 3%, or about 1%) decrease in brightness due to this tuning process compared to display devices without light blocking elements 238. As the secondary light from phosphor films 236 having luminescent nanostructures such as QDs typically exhibit narrow spectral emission widths, the tuning process may not require absorption of wide range of wavelengths to achieve the desired color gamut coverage as required in current non-QD based display devices to achieve similar color gamut coverage.

Wide spectral emission width is one of the limitations in current non-QD based display devices (e.g., YAG-phosphor based display devices) in achieving wide color gamut coverage of, for example, the Rec. 2020 color space. Use of absorbing elements such as light blocking elements 238 in current non-QD based display devices may achieve wide color gamut coverage (e.g., 80-90% Rec. 2020 color gamut coverage), but at the cost of significant decrease in brightness. Such decrease in brightness may not only adversely affect the image quality of the current display devices, but also fail to meet the brightness level required under the HDR imaging standards.

Light blocking elements 238 may include one or more non-phosphor materials. That is, the one or more non-phosphor materials exhibit optical absorption properties and/or optical scattering properties, but do not exhibit optical emission properties. The one or more non-phosphor materials may be selected based on their optical absorption properties to absorb and/or on their scattering properties to scatter only the one or more wavelengths or range of wavelengths that require absorbing and/or scattering during the above described blocking and tuning processes. In some embodiments, the one or more non-phosphor materials may include the same absorption property. In some embodiment, each of the one or more non-phosphor materials includes an absorption property different from each other.

The one or more non-phosphor materials may be selected such that they may be inexpensively disposed on phosphor films 236 or any other layer/structure of LCD display device 200 to form light blocking elements 238. For example, the one or more non-phosphor materials may be dye (e.g., narrow band organic Exciton P491 dye), ink, paint, polymeric material, an/or any material that may be sprayed, painted, spin-coated, printed, or any other suitable low temperature (e.g., below 100° C.) deposition method. Printing may be done using, for example, a plotter, an inkjet printer, or a screen printer. In some embodiments, the one or more non-phosphor materials may be directly disposed on phosphor films 238. In some embodiments, the one or more non-phosphor materials may be scattering materials that include films or particles (e.g., particles having diameters ranging from about 100 nm to about 500 μm) of titanium oxide, zinc oxide, zinc sulfide, silicone, or a combination thereof. In some embodiments, light blocking elements 238 may include a substrate having the one or more non-phosphor materials disposed on it.

In some embodiments, light blocking elements 238 may be segmented films that are placed adjacent to each other on phosphor films 236 or on an optically transparent substrate (not shown). The segmented light blocking elements 238 may be placed in a manner such that there is negligible gap at interfaces between adjacent light blocking elements 238. In alternate embodiments, each of light blocking elements 238 may be different regions of a continuous film placed on phosphor films 236. Thus, FIG. 2A is not depicted to scale.

In some embodiments, light blocking elements 238 may not be a separate structure as shown in FIG. 2A, but may be included in phosphor films 236. That is, phosphor films 236 may be a composite film comprising the luminescent nanostructures, as described above, along with light blocking elements 238. The one or more non-phosphor materials of light blocking elements 238 such as dye, ink, paint, polymeric material, scattering materials (e.g., particles having diameters ranging from about 100 nm to about 500 μm), or a combination thereof may be incorporated or embedded in a matrix of phosphor films 236. The one or more non-phosphor materials may include nanostructured materials that may be dispersed in a matrix of phosphor films 236. These nanostructured materials may exhibit optical absorption properties and/or optical scattering properties and may not exhibit any optical emission properties. In some embodiments, light blocking elements 238 may be included in optically transparent substrate 228, which may also be configured to provide environmental sealing to the underlying layers and/or structures of LCD module 204 and/or BLU 202. In alternate embodiments, light blocking elements 238 may be included in second polarizing filter 222, which may be positioned between substrate 228 and phosphor films 236.

Display screen 230 may be configured to generate images. Display screen 230 may be a touch screen display, according to an embodiment. LCD display device 200 may further include one or more medium materials (not shown) disposed between any of the adjacent elements in LCD display device 200, for example between optical cavity 212 and LCD module 204, on either sides of LC solution layer 220, or between any other elements of LCD display device 200. The one or more medium materials may include, but not limited to, substrates, a vacuum, air, gas, optical materials, adhesives, optical adhesives, glass, polymers, solids, liquids, gels, cured materials, optical coupling materials, index-matching or index-mismatching materials, index-gradient materials, cladding or anti-cladding materials, spacers, epoxy, silica gel, silicones, brightness-enhancing materials, scattering or diffuser materials, reflective or anti-reflective materials, wavelength-selective materials, wavelength-selective anti-reflective materials, or other suitable medium material. Suitable materials may include silicones, silicone gels, silica gel, epoxies (e.g., Loctite™ Epoxy E-30CL), acrylates (e.g., 3M™ Adhesive 2175). The one or more medium materials may be applied as a curable gel or liquid and cured during or after deposition, or pre-formed and pre-cured prior to deposition. Curing methods may include UV curing, thermal curing, chemical curing, or other suitable curing methods known in the art. Index-matching medium materials may be chosen to minimize optical losses between elements of BLU 202 and LCD module 204.

LCD display device 200 may have a geometric shape, such as but not limited to cylindrical, trapezoidal, spherical, or elliptical, according to various embodiments, without departing from the spirit and scope of the present invention. LCD display device 200 is not restricted to being cuboid in shape or having other straight-sided shapes. It should be noted that the rectangular cross-sectional shape of LCD display device 200 is for illustrative purposes, and is not limiting. LCD display device 200 may have other cross-sectional shapes (e.g., trapezoid, oblong, rhomboid), according to various embodiments, without departing from the spirit and scope of the present invention. It should also be noted that even though optical cavity 212, substrates 216 and 228, polarizing filter 214 and 222, and display screen 230 are shown in FIG. 2A to have similar dimensions along X-axis, a person skilled in the art would understand that each of these components may have dimensions different from each other in one or more directions, according to various embodiments.

Figure 2B:
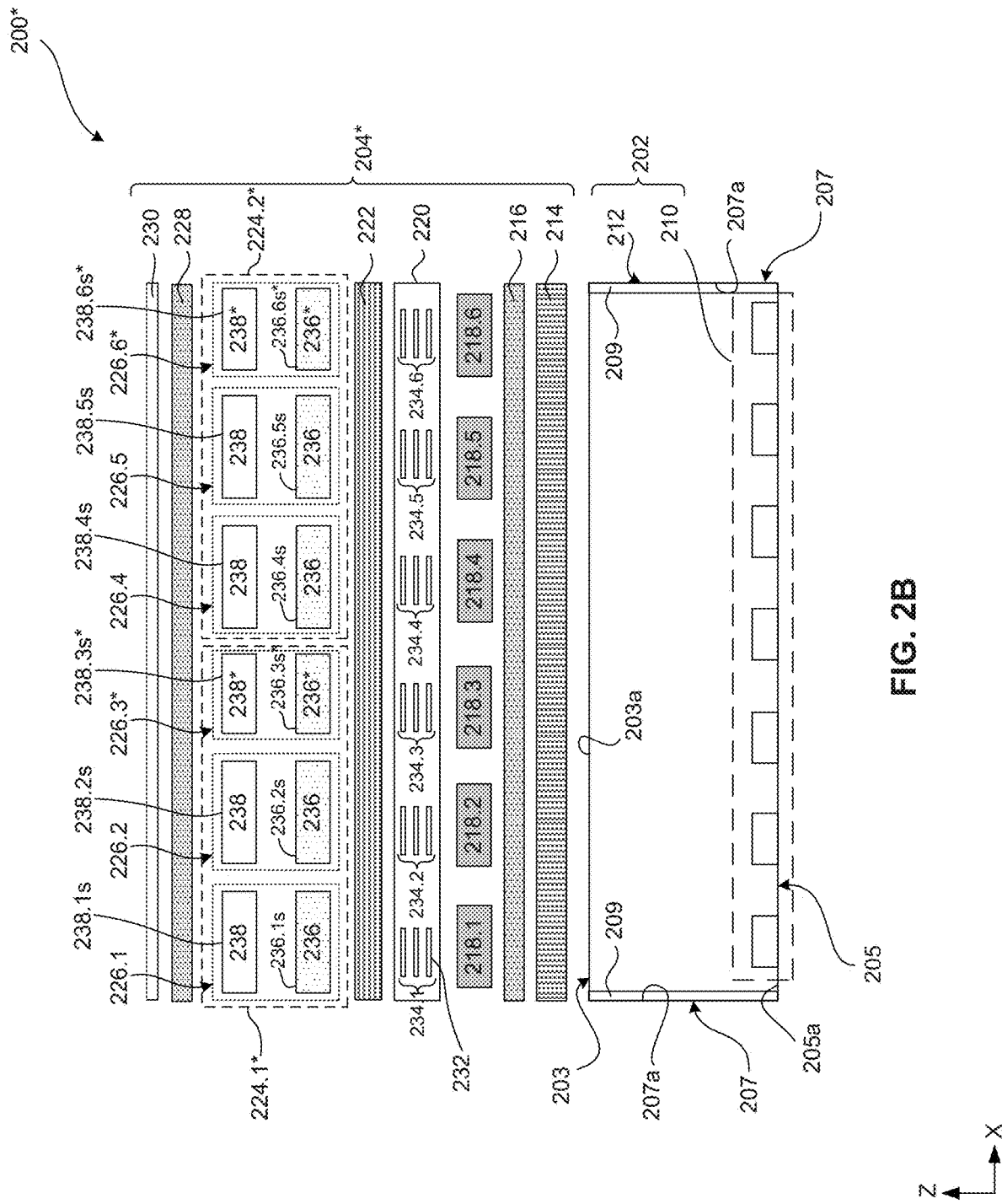

FIG. 2B illustrates an LCD display device 200*, which is an alternate embodiment of LCD display device 200. LCD display device 200* may include LEDs 210 having blue LEDs. LCD display device 200* may further include blue sub-pixels 226.3* and 226.6* that have film elements 236* and 238* instead of phosphor films 236 and light blocking elements 238 described above. Film elements 236* and 238* may exclude luminescent nanostructures such as QDs and may be optically transparent to blue light from blue LEDs 210. Such exclusion and transparency may be possible because down-conversion of primary blue light from blue LEDs 210 and/or blocking of blue light may not be needed for blue sub-pixels 226.3* and 226.6*. In some embodiments, film elements 236* and 238* include scattering components to scatter the blue light from blue LEDs 210, such that the angular distribution of light from blue sub-pixels 226.3* and 226.6* matches that from the green sub-pixels 226.2 and 226.5, and red sub-pixels 226.1 and 226.4.

The above discussion of display device 200, LCD module 204, pixels 224.1 and 224.2, and sub-pixels 226.3 and 226.6 applies to display device 200*, LCD module 204*, pixels 224.1* and 224.2*, and sub-pixels 226.3* and 226.6, unless mentioned otherwise. Elements in FIG. 2B with the same annotations as elements in FIG. 2A are described above. Sub-pixels 226.1, 226.2, and 226.3* may be similar in structure, composition, and function to respective sub-pixels 226.4, 226,5, and 226.6*, according to some embodiments. The description of sub-pixels 226.1, 226,2, and 226.3* applies to sub-pixels 226.4, 226,5, and 226.6*, respectively, unless mentioned otherwise.

In some embodiments, sub-pixels 226.1, 226.2, and 226.3* may have emissive surfaces along a plane (e.g., XY plane) that may be substantially parallel to a plane of display screen 230 along which light from these sub-pixels are distributed. The term "emissive surface of a sub-pixel" is used herein to refer to a surface of a topmost layer of the sub-pixel from which light is emitted towards a display screen of a display device.

In some embodiments, top surfaces 238.1$s$, 238.2$s$, and 238.3$s$* of light blocking elements 238 and film 238* may form the emissive surfaces of sub-pixels 226.1, 226.2, and 226.3*, respectively. Similarly, top surfaces 238.4$s$, 238.5$s$, 238.6$s$* may form the emissive surfaces of sub-pixels 226.4, 226.5, and 226.6*, respectively.

In alternate embodiments, sub-pixels 226.1, 226.2, 226.3*, 226.4, 226.5, and 226.6* may exclude light blocking elements 238 and film 238*, and may have phosphor films 236 and film elements 236* as the topmost layers in these sub-pixels. In this embodiment, top surfaces 236.1$s$, 236.2$s$, 236.3$s$*, 236.4$s$, 236.5$s$, and 236.6$s$* may form the emissive surfaces of these sub-pixels.

In some embodiments, areas of the emissive surfaces (also referred as emissive surface areas) of sub-pixels 226.1, 226.2, and 226.3* are such that the total light emitted from each of sub-pixels 226.1, 226.2, and 226.3* produces a desired white point. For example, the emissive surface area of each of sub-pixels 226.1, 226.2, and 226.3* may be chosen such that the total luminance from each of red, green, and blue sub-pixels 226.1, 226.2, and 226.3*, respectively, achieves the desired white point value and brightness on display screen 230 required by high dynamic range (HDR) imaging standards.

The relative areas of the emissive surfaces of sub-pixels 226.1, 226.2, and 226.3* may be based on the relative luminance of the red, green, and blue lights emitted from sub-pixels 226.1, 226.2, and 226.3*, respectively. The term "luminance" is used herein to refer to a light intensity per unit area of an emissive surface. The relative luminance of these red, green, and blue lights may depend on the down-conversion efficiency of luminescent nanostructures such as QDs (e.g., QDs 600 of FIG. 6) in phosphor films 236 of red and green sub-pixels 226.1 and 226.2 and on the luminance of blue light from blue LEDs 210.

In an example where the emissive surface area of each of sub-pixels 226.1, 226.2, and 226.3* is substantially the same, the luminance of the primary blue light from blue LEDs 210 may be stronger than the luminance of the red and/or green light emitted from red and green sub-pixels 226.1 and 226.2. This higher luminance of the blue light may be because the blue light from sub-pixel 226.3* is the primary blue light from blue LEDs 210, and not from down-conversion of the primary blue light. Down-conversion of a primary light may lose some of the luminance of the primary light as in the case of the emitted red and/or green lights, which result from down-conversion of the primary blue light in respective sub-pixels 226.1 and 226.2. Hence, the relative areas of the emissive surfaces of sub-pixels 226.1, 226.2, and 226.3\* may depend on the down-conversion efficiency of the luminescent nanostructures in phosphor films 236 of red and green sub-pixels 226.1 and 226.2 and on the luminance of the primary blue light from blue LEDs 210.

In some embodiments, the emissive surface area of blue sub-pixel 226.3\* may be smaller than emissive surface areas of red sub-pixel 226.1 and/or green sub-pixel 226.2. In some embodiments, a first ratio between the emissive surface areas of sub-pixels 226.1, 226.2, and 226.3\* and a second ratio between the emissive surface areas of sub-pixels 226.4 226.5, and 226.6\* may each range from about 2:2:1 to about 6:6:1 (e.g., about 2:3:1, about 3:2:1, about 3:3:1, about 4:3:1, about 3:4;1, about 4:4:1, about 5:4:1, about 4:5:1, about 5:5:1, about 6:5:1, about 5:6:1, or about 6:6:1). Such dimensions of sub-pixels 226.1, 226,2, and 226.3\* may achieve over 60% (e.g., about 70%, about 80%, or about 90%) increase in brightness in LCD display device 200\* for a white point value compared to LCD display devices having equal sized red, green, and blue sub-pixels per pixel.

In some embodiments, the combined emissive surface areas of sub-pixels 226.1, 226.2, and 226.3\* may form the emissive surface area of pixel 224.1 and the combined emissive surface areas of sub-pixels 226.4, 226.5, and 226.6\* may form the emissive surface area of pixel 224.2. In some embodiments, emissive surface areas of pixels 224.1\* and 224.2\* may be substantially equal to each other, even though the respective first and second ratios are different from each other.

Based on the disclosure herein, a person of ordinary skill in the art will recognize that other ratios for the first and second ratios are within the scope and spirit of this disclosure.

Figure 3:
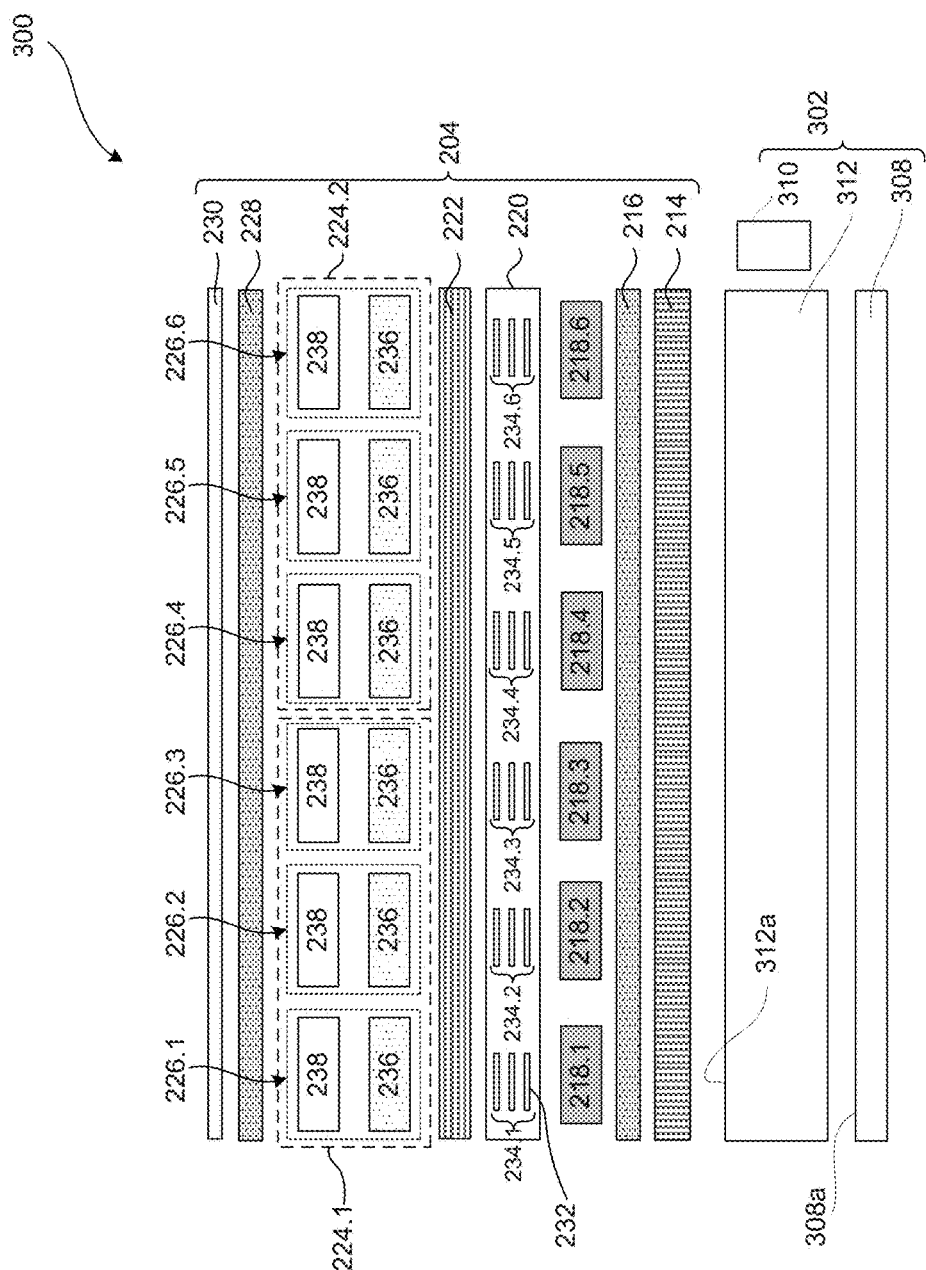

FIG. 3 illustrates a schematic of an exploded cross-sectional view of an edge-lit LCD display device 300, according to an embodiment. LCD display device 300 may include a BLU 302 and LCD module 204. Elements in FIG. 3 with the same annotations as elements in FIG. 2A are described above.

BLU 302 may include an LED 310 (e.g., a blue LED or a UV LED), a light guide plate (LGP) 312, and a reflector 308. BLU 302 may be configured to provide a primary light (e.g., a blue light or a UV light) that may be processed through LCD module 204 and subsequently, transmitted to and distributed across display screen 230. The blue LED may emit in the range from about 440 nm to about 470 nm. According to an embodiment, the blue LED may be, for example, a GaN LED that emits blue light at a wavelength of 450 nm.

LGP 312 may include fiber optic cables, polymeric or glass solid bodies such as plates, films, containers, or other structures, according to some embodiments. The size of LGP 312 may depend on the ultimate application and characteristics of LED 310. The thickness of LGP 312 may be compatible with thickness of LED 310. The other dimensions of LGP 312 may be designed to extend beyond the dimensions of LED 310, and may be on the order of 10's of millimeters, to 10's to 100's of centimeters.

In some embodiments, the materials of LGP 312 may include polycarbonate (PC), poly methyl methacrylate (PMMA), methyl methacrylate, styrene, acrylic polymer resin, glass, or other suitable LGP materials. Suitable manufacturing methods for LGP 312 may include injection molding, extrusion, or other suitable embodiments. LGP 312 may be configured to provide uniform primary light emission, such that primary light entering LCD module 204 may be of uniform color and brightness. LGP 312 may include a substantially uniform thickness over the entire LGP 512 surface. Alternatively, LGP 312 may have a wedge-like shape. In some embodiments, LGP 312 may be optically coupled to LED 310 and may be physically connected to or detached from LED 310. For physically connecting LGP 312 to LED 310, optically transparent adhesive may be used (not shown).

In some embodiments, BLU 302 may include an array of LEDs (not shown), each of which may be similar to LED 310 in structure and function. The array of LEDs may be adjacent to LGP 312 and may be configured to provide the primary light to LCD module 204 for processing and for subsequent transmission to display screen 230 as discussed above with reference to FIG. 2A.

In some embodiments, reflector 308 may be configured to increase the amount of light that is emitted from LGP 512. Reflector 308 may comprise a suitable material, such as a reflective mirror, a film of reflector particles, a reflective metal film, or other suitable conventional reflectors. In some embodiments, reflector 308 may include a white film. In some embodiments, reflector 308 may include additional functionality or features, such as scattering, diffuser, or brightness-enhancing features.

In alternate embodiments, LCD display device 300 may have LCD module 204\* as shown in FIG. 2B instead of LCD module 204 as shown in FIG. 2A.

Example Embodiments of an Organic Light Emitting Diode (OLED) Display Device

FIG. 4 illustrates a schematic of an exploded cross-sectional view of an organic light emitting diode (OLED) display device 400, according to an embodiment. OLED display device 400 may include a back plate 418, a plurality of pixels 424 arranged in a 2-D array on back plate 418, and a transmissive cover plate 430, according to an embodiment. The number of pixels shown in FIG. 4 is illustrative and is not limiting. OLED display device 400 may have any number pixels without departing from the spirit and scope of this disclosure.

Cover plate 430 may serve as display screen to generate images and/or may be configured to provide environmental sealing to underlying structures of OLED display device 400. Cover plate 430 may be also configured to be an optically transparent substrate on which other components (e.g., electrode) of OLED display device 400 may be disposed. In some embodiments, pixels 424 may be tri-chromatic having red, green, and blue sub-pixels. In some embodiments, pixels 424 may be monochromatic having either red, green, or blue sub-pixels. In some embodiments, OLED display device 400 may have a combination of both tri-chromatic and monochromatic pixels 424.

OLED display device 400 may further include control circuitry (not shown) of pixels 424. Pixels 424 may be independently controlled by switching devices such as, for example, thin film transistors (TFTs). OLED display device 400 may have a geometric shape, such as but not limited to cylindrical, trapezoidal, spherical, or elliptical, according to various embodiments, without departing from the spirit and scope of the present invention. It should be noted that even though back plate 418, array of pixels 424, and cover plate 430 are shown in FIG. 4 to have similar dimensions along X-axis, a person skilled in the art would understand that each of these components may have dimensions different from each other in one or more directions, according to various embodiments.

FIG. 5A illustrates an exploded cross-sectional view of a tri-chromatic pixel 524 of an OLED display device, according to an embodiment. One or more of pixels 424 of OLED display device 400 of FIG. 4 may have a configuration similar to pixel 524. Pixel 524 may include a red sub-pixel 540, a green sub-pixel 542, and a blue sub-pixel 544. The arrangement order of red, green, and blue sub-pixels 540, 542, and 544 is illustrative and is not limiting. The red, green, and blue sub-pixels 540, 542, and 544 may be arranged in any order with respect to each other.

Each of red, green, and blue sub-pixels 540, 542, and 544 may include a light source 546 (e.g., a blue OLED or a UV OLED) and a light blocking element 548. The above discussion of light blocking elements 238 applies to light blocking elements 548 unless mentioned otherwise.

Red sub-pixel 540 may further include a phosphor film 550 disposed on an emitting surface of light source 546 of red sub-pixel 540. Phosphor film 550 may have luminescent nanostructures such as QDs (e.g., QD 600 described with reference to FIG. 6) that absorb primary light from light source 546 of red sub-pixel 540 and emit red light having a primary emission peak wavelength in the red wavelength region of the visible spectrum.

Green sub-pixel 542 may further include a phosphor film 552 disposed on an emitting surface of light source 546 of green sub-pixel 542. Phosphor film 552 may have luminescent nanostructures such as QDs (e.g., QD 600 described with reference to FIG. 6) that absorb primary light from light source 546 of green sub-pixel 542 and emit green light having a primary emission peak wavelength in the green wavelength region of the visible spectrum.

Blue sub-pixel 544 may further include a phosphor film 554 disposed on an emitting surface of light source 546 of blue sub-pixel 544 when light source 546 has a UV OLED, according to an embodiment. Phosphor film 554 may have luminescent nanostructures such as QDs (e.g., QD 600 described with reference to FIG. 6) that absorb primary light from the UV OLED and emit blue light having a primary emission peak wavelength in the blue wavelength region of the visible spectrum.

Light blocking elements 548 may be configured to filter the red, green, and blue lights emitted from respective phosphor films 550, 552, and 554 before travelling to a cover plate such as cover plate 430 of FIG. 4. Light blocking elements 548 may be configured to allow the red, green, and blue lights from respective phosphor films 550, 552, and 554 to pass and to block portions of primary light from light source 546 that are not absorbed by phosphor films 550, 552, and 554, and down-converted to the red, green, and blue light, respectively. The unwanted portions of the primary light that may have leaked out of phosphor films 550, 552, and 554 may be blocked by absorbing and/or scattering them. Light blocking elements 548 may be also configured to tune the spectral emission widths (also referred as width of emission spectrum) of the red, green, and blue light emitted from respective phosphor films 550, 552, and 554 to achieve a desired color gamut coverage of OLED display device 400.

In some embodiments, light blocking elements 548 may not be a separate structure as shown in FIG. 5A, but may be included in phosphor films 550, 552, and 554. That is, phosphor films 550, 552, and 554 may be composite films comprising the luminescent nanostructures, as described above, along with light blocking elements 548. The one or more non-phosphor materials of light blocking elements 548 such as dye, ink, paint, polymeric material, scattering materials (e.g., particles having diameters ranging from about 100 nm to about 500 μm), or a combination thereof may be incorporated or embedded in matrices of phosphor films 550, 552, and 554. The one or more non-phosphor materials may include nanostructured materials that may be dispersed in matrices of phosphor films 550, 552, and 554. These nanostructured materials may exhibit optical absorption properties and/or optical scattering properties and may not exhibit any optical emission properties.

FIG. 5B illustrates a pixel 524*, which is an alternate embodiment of OLED based pixel 524 shown in FIG. 5A. Pixel 524* may include light source 546 having a blue OLED. Pixel 524* may further include optically transparent films 554* and 548* instead of phosphor film 554 and light blocking element 548 described above. The optically transparent films 554* and 548* may exclude luminescent nanostructures such as QDs and may be optically transparent to blue light from blue OLED 546. Such exclusion and transparency may be possible because down-conversion of primary blue light from blue OLED 546 and/or blocking of blue light may not be needed for blue sub-pixel 544*.

The above discussion of blue sub-pixel 544 applies to blue sub-pixel 544*, unless mentioned otherwise. Elements in FIG. 5B with the same annotations as elements in FIG. 5A are described above.

In some embodiments, sub-pixels 540, 542, and 544* may have emissive surfaces along a plane (e.g., XY plane) that may be substantially parallel to a plane of display screen (e.g., display screen 430) along which light from these sub-pixels are distributed. In some embodiments, top surfaces 540s, 542s, and 548* of light blocking elements 548 and film 548* may form the emissive surfaces of sub-pixels 540, 542, and 544*, respectively.

In alternate embodiments, sub-pixels 540, 542, and 544* may exclude light blocking elements 548 and film 548*, and may have phosphor films 550 and 552 and film 554* as the topmost layers in these sub-pixels. In this embodiment, top surfaces 550s, 552s, and 554* may form the emissive surfaces of these sub-pixels.

In some embodiments, areas of the emissive surfaces of sub-pixels 540, 542, and 544* are such that the total luminance emitted from each of sub-pixels 540, 542, and 544* produces a desired white point. The relative areas of these emissive surfaces may be based on the relative luminance of the red, green, and blue lights emitted from sub-pixels 540, 542, and 544*, respectively. The relative luminance of these red, green, and blue lights may depend on the down-conversion efficiency of luminescent nanostructures such as QDs (e.g., QDs 600 of FIG. 6) in phosphor films 550 and 552 of respective red and green sub-pixels 540 and 542 and on the luminance of blue light from blue OLED 546. Hence, the relative areas of the emissive surfaces of sub-pixels 540, 542, and 544* may depend on the down-conversion efficiency of the luminescent nanostructures of red and green sub-pixels 540 and 542 and on the luminance of the primary blue light from blue OLED 546.

In some embodiments, emissive surface area of blue sub-pixel 544* may be smaller than emissive surface areas of red sub-pixel 542 and/or green sub-pixel 542. In some embodiments, a ratio between the emissive surface areas of sub-pixels 540, 542, and 544* may range from about 3:3:1 to about 6:6:1 (e.g., about 4:3:1, about 3:4;1, about 4:4:1, about 5:4:1, about 4:5:1, about 5:5:1, about 6:5:1, about 5:6:1, or 6:6:1).

In some embodiments, the combined emissive surface areas of sub-pixels 540, 542, and 544* may form the emissive surface area of pixel 524*. In some embodiments, emissive surface areas of adjacent pixels (e.g., a pair of pixel 524*) may be substantially equal to each other, even though the ratios between the emissive surface areas of sub-pixels included in respective one of the adjacent pixels are different from each other.

Example Embodiments of a Barrier Layer Coated Nanostructure

Figure 6:
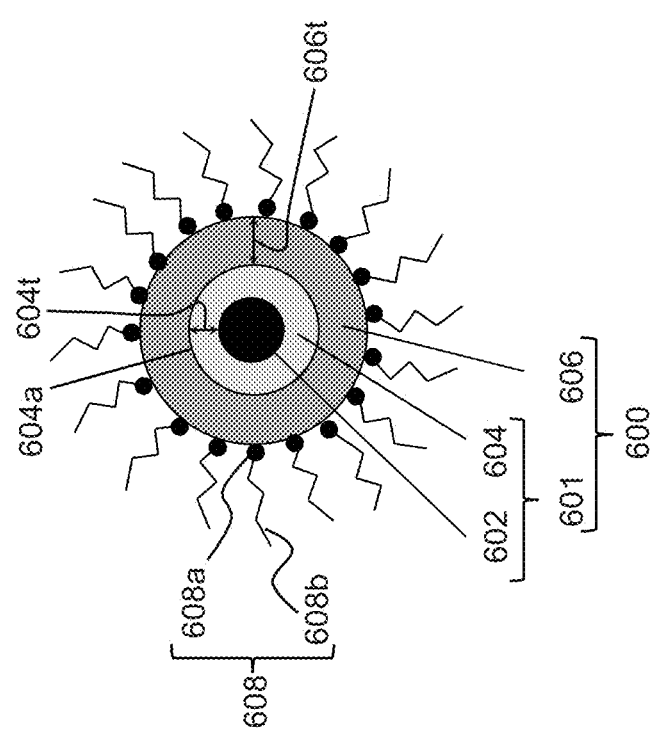
FIG. 6 is a schematic of a cross-sectional view of a nanostructure, according to an embodiment.

FIG. 6 illustrates a cross-sectional structure of a barrier layer coated luminescent nanostructure (NS) 600, according to an embodiment. In some embodiments, a population of NS 600 may be included in phosphor films 236, 550, 552, and/or 554. Barrier layer coated NS 600 includes a NS 601 and a barrier layer 606. NS 601 includes a core 602 and a shell 604. Core 602 includes a semiconducting material that emits light upon absorption of higher energies. Examples of the semiconducting material for core 602 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap may be used as well. In an embodiment, core 602 may also include one or more dopants such as metals, alloys, to provide some examples. Examples of metal dopant may include, but not limited to, zinc (Zn), Copper (Cu), aluminum (Al), platinum (Pt), chrome (Cr), tungsten (W), palladium (Pd), or a combination thereof. The presence of one or more dopants in core 602 may improve structural and optical stability and QY of NS 601 compared to undoped NSs.

Core 602 may have a size of less than 20 nm in diameter, according to an embodiment. In another embodiment, core 602 may have a size between about 1 nm and about 5 nm in diameter. The ability to tailor the size of core 602, and consequently the size of NS 601 in the nanometer range enables photoemission coverage in the entire optical spectrum. In general, the larger NSs emit light towards the red end of the spectrum, while smaller NSs emit light towards the blue end of the spectrum. This effect arises as larger NSs have energy levels that are more closely spaced than the smaller NSs. This allows the NS to absorb photons containing less energy, i.e. those closer to the red end of the spectrum.

Shell 604 surrounds core 602 and is disposed on outer surface of core 602. Shell 604 may include cadmium sulfide (CdS), zinc cadmium sulfide (ZnCdS), zinc selenide sulfide (ZnSeS), and zinc sulfide (ZnS). In an embodiment, shell 604 may have a thickness 604*t*, for example, one or more monolayers. In other embodiments, shell 604 may have a thickness 604*t* between about 1 nm and about 5 nm. Shell 604 may be utilized to help reduce the lattice mismatch with core 602 and improve the QY of NS 601. Shell 604 may also help to passivate and remove surface trap states, such as dangling bonds, on core 602 to increase QY of NS 601. The presence of surface trap states may provide non-radiative recombination centers and contribute to lowered emission efficiency of NS 601.

In alternate embodiments, NS 601 may include a second shell disposed on shell 604, or more than two shells surrounding core 602, without departing from the spirit and scope of the present invention. In an embodiment, the second shell may be on the order of two monolayers thick and is typically, though not required, also a semiconducting material. Second shell may provide protection to core 602. Second shell material may be zinc sulfide (ZnS), although other materials may be used as well without deviating from the scope or spirit of the invention.

Barrier layer 606 is configured to form a coating on NS 601. In an embodiment, barrier layer 606 is disposed on and in substantial contact with outer surface 604*a* of shell 604. In embodiments of NS 601 having one or more shells, barrier layer 606 may be disposed on and in substantial contact with the outermost shell of NS 601. In an example embodiment, barrier layer 606 is configured to act as a spacer between NS 601 and one or more NSs in, for example, a solution, a composition, and/or a film having a plurality of NSs, where the plurality of NSs may be similar to NS 601 and/or barrier layer coated NS 600. In such NS solutions, NS compositions, and/or NS films, barrier layer 606 may help to prevent aggregation of NS 601 with adjacent NSs. Aggregation of NS 601 with adjacent NSs may lead to increase in size of NS 601 and consequent reduction or quenching in the optical emission properties of the aggregated NS (not shown) including NS 601. In further embodiments, barrier layer 606 provides protection to NS 601 from, for example, moisture, air, and/or harsh environments (e.g., high temperatures and chemicals used during lithographic processing of NSs and/or during manufacturing process of NS based devices) that may adversely affect the structural and optical properties of NS 601.

Barrier layer 606 includes one or more materials that are amorphous, optically transparent and/or electrically inactive. Suitable barrier layers include inorganic materials, such as, but not limited to, inorganic oxides and/or nitrides. Examples of materials for barrier layer 606 include oxides and/or nitrides of Al, Ba, Ca, Mg, Ni, Si, Ti, or Zr, according to various embodiments. Barrier layer 606 may have a thickness 606*t* ranging from about 8 nm to about 15 nm in various embodiments.

As illustrated in FIG. 6, barrier layer coated NS 600 may additionally or optionally include a plurality of ligands or surfactants 608, according to an embodiment. Ligands or surfactants 608 may be adsorbed or bound to an outer surface of barrier layer coated NS 600, such as on an outer surface of barrier layer 606, according to an embodiment. The plurality of ligands or surfactants 608 may include hydrophilic or polar heads 608*a* and hydrophobic or non-polar tails 608*b*. The hydrophilic or polar heads 608*a* may be bound to barrier layer 606. The presence of ligands or surfactants 608 may help to separate NS 600 and/or NS 601 from other NSs in, for example, a solution, a composition, and/or a film during their formation. If the NSs are allowed to aggregate during their formation, the quantum efficiency of NSs such as NS 600 and/or NS 601 may drop. Ligands or surfactants 608 may also be used to impart certain properties to barrier layer coated NS 600, such as hydrophobicity to provide miscibility in non-polar solvents, or to provide reaction sites (e.g., reverse micellar systems) for other compounds to bind.

A wide variety of ligands exist that may be used as ligands 608. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is diphenylphosphine.

A wide variety of surfactants exist that may be used as surfactants 608. Nonionic surfactants may be used as surfactants 608 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants may be used as surfactants 608 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, NSs 601 and/or 600 may be synthesized to emit light in one or more various color ranges, such as red, orange, and/or yellow range. In some embodiments, NSs 601 and/or 600 may be synthesized to emit light in the green and/or yellow range. In some embodiments, NSs 601 and/or 600 may be synthesized emit light in the blue, indigo, violet, and/or ultra-violet range. In some embodiments, NSs 601 and/or 600 may be synthesized to have a primary emission peak wavelength between about 605 nm and about 650 nm, between about 510 nm and about 550 nm, or between about 300 nm and about 480 nm.

NSs 601 and/or 600 may be synthesized to display a high QY. In some embodiments, NSs 601 and/or 600 may be synthesized to display a QY between 80% and 95% or between 85% and 90%.

Thus, according to various embodiments, NSs 600 may be synthesized such that the presence of barrier layer 606 on NSs 601 does not substantially change or quench the optical emission properties of NSs 601.

Example Embodiments of a Nanostructure Film

Figure 7:
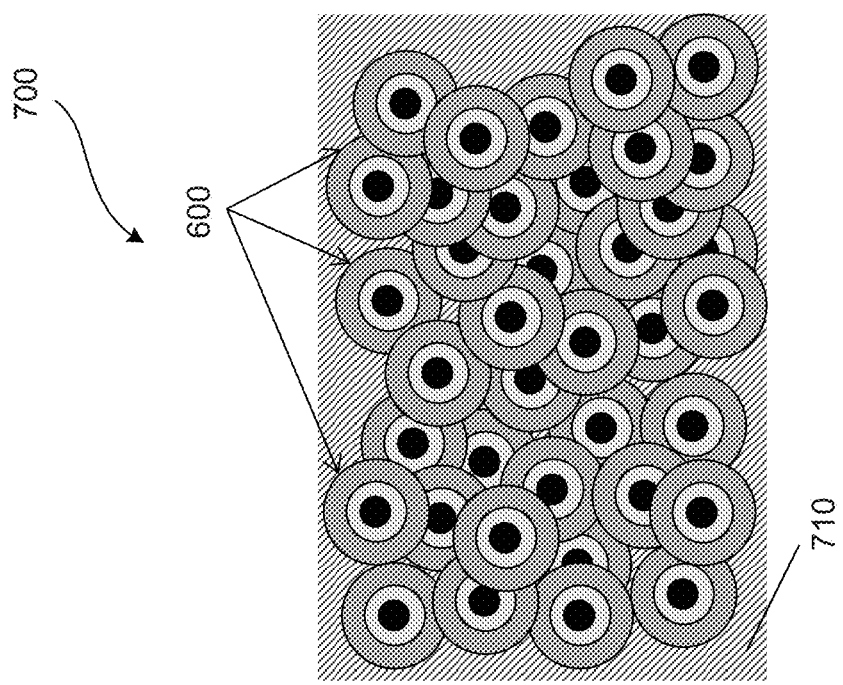
FIG. 7 is a schematic of a nanostructure film, according to an embodiment.

FIG. 7 illustrates a cross-sectional view of a NS film 700, according to an embodiment. In some embodiments, phosphor films 236, 550, 552, and/or 554 may be similar to NS film 700.

NS film 700 may include a plurality of barrier layer coated core-shell NSs 600 (FIG. 6) and a matrix material 710, according to an embodiment. NSs 600 may be embedded or otherwise disposed in matrix material 710, according to some embodiments. As used herein, the term "embedded" is used to indicate that the NSs are enclosed or encased within matrix material 710 that makes up the majority component of the matrix. It should be noted that NSs 600 may be uniformly distributed throughout matrix material 710 in an embodiment, though in other embodiments NSs 600 may be distributed according to an application-specific uniformity distribution function. It should be noted that even though NSs 600 are shown to have the same size in diameter, a person skilled in the art would understand that NSs 600 may have a size distribution.

In an embodiment, NSs 600 may include a homogenous population of NSs having sizes that emit in the blue visible wavelength spectrum, in the green visible wavelength spectrum, or in the red visible wavelength spectrum. In other embodiments, NSs 600 may include a first population of NSs having sizes that emit in the blue visible wavelength spectrum, a second population of NSs having sizes that emit in the green visible wavelength spectrum, and a third population of NSs that emit in the red visible wavelength spectrum.

Matrix material 710 may be any suitable host matrix material capable of housing NSs 600. Suitable matrix materials may be chemically and optically compatible with NSs 600 and any surrounding packaging materials or layers used in applying NS film 700 to devices. Suitable matrix materials may include non-yellowing optical materials which are transparent to both the primary and secondary light, thereby allowing for both primary and secondary light to transmit through the matrix material. In an embodiment, matrix material 710 may completely surround each of the NSs 600. The matrix material 710 may be flexible in applications where a flexible or moldable NS film 700 is desired. Alternatively, matrix material 710 may include a high-strength, non-flexible material.

Matrix material 710 may include polymers and organic and inorganic oxides. Suitable polymers for use in matrix material 710 may be any polymer known to the ordinarily skilled artisan that can be used for such a purpose. The polymer may be substantially translucent or substantially transparent. Matrix material 710 may include, but not limited to, epoxies, acrylates, norbornene, polyethylene, poly(vinyl butyral):poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides which combine with ligand amines (e.g., APS or PEI ligand amines) to form epoxy, and the like.

In some embodiments, matrix material 710 includes scattering microbeads such as $TiO_2$ microbeads, ZnS microbeads, or glass microbeads that may improve photo conversion efficiency of NS film 700. In some embodiments, matrix material 710 may include light blocking elements such as light blocking elements 238 and/or 548 described above with reference to FIGS. 2-3 and 5.

In another embodiment, matrix material 710 may have low oxygen and moisture permeability, exhibit high photo- and chemical-stability, exhibit favorable refractive indices, and adhere to outer surfaces of NSs 600, thus providing an air-tight seal to protect NSs 600. In another embodiment, matrix material 710 may be curable with UV or thermal curing methods to facilitate roll-to-roll processing.

According to some embodiments, NS film 700 may be formed by mixing NSs 600 in a polymer (e.g., photoresist) and casting the NS-polymer mixture on a substrate, mixing NSs 600 with monomers and polymerizing them together, mixing NSs 600 in a sol-gel to form an oxide, or any other method known to those skilled in the art.

According to some embodiments, the formation of NS film 700 may include a film extrusion process. The film extrusion process may include forming a homogenous mixture of matrix material 710 and barrier layer coated core-shell NSs such as NS 600, introducing the homogenous mixture into a top mounted hopper that feeds into an extruder. In some embodiments, the homogenous mixture may be in the form of pellets. The film extrusion process may further include extruding NS film 700 from a slot die and passing extruded NS film 700 through chill rolls. In some embodiments, the extruded NS film 700 may have a thickness less than about 75 µm, for example, in a range from about 70 µm to about 40 µm, from about 65 µm to about 40 µm, from about 60 µm to about 40 µm, or form about 50 µm to about 40 µm. In some embodiments, NS film 700 has a thickness less than about 10 µm. In some embodiments, the formation of NS film 700 may optionally include a secondary process followed by the film extrusion process. The secondary process may include a process such as co-extrusion, thermoforming, vacuum forming, plasma treatment, molding, and/or embossing to provide a texture to a top surface of NS film 700. The textured top surface NS film 700 may help to improve, for example defined optical diffusion property and/or defined angular optical emission property of NS film 700.

Example Embodiments of Luminescent Nanostructures

Described herein are various compositions having luminescent nanostructures (NSs). The various properties of the luminescent nanostructures, including their absorption properties, emission properties and refractive index properties, may be tailored and adjusted for various applications.

The material properties of NSs may be substantially homogenous, or in certain embodiments, may be heterogeneous. The optical properties of NSs may be determined by their particle size, chemical or surface composition. The ability to tailor the luminescent NS size in the range between about 1 nm and about 15 nm may enable photoemission coverage in the entire optical spectrum to offer great versatility in color rendering. Particle encapsulation may offer robustness against chemical and UV deteriorating agents.

Luminescent NSs, for use in embodiments described herein may be produced using any method known to those skilled in the art. Suitable methods and example nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties.

Luminescent NSs for use in embodiments described herein may be produced from any suitable material, including an inorganic material, and more suitably an inorganic conductive or semiconductive material. Suitable semiconductor materials may include those disclosed in U.S. patent application Ser. No. 10/796,832, and may include any type of semiconductor, including group II-VI, group III-V, group IV-VI and group IV semiconductors. Suitable semiconductor materials may include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and an appropriate combination of two or more such semiconductors.

In certain embodiments, the luminescent NSs may have a dopant from the group consisting of a p-type dopant or an n-type dopant. The NSs may also have II-VI or III-V semiconductors. Examples of II-VI or III-V semiconductor NSs may include any combination of an element from Group II, such as Zn, Cd and Hg, with any element from Group VI, such as S, Se, Te and Po, of the Periodic Table; and any combination of an element from Group III, such as B, Al, Ga, In, and Tl, with any element from Group V, such as N, P, As, Sb and Bi, of the Periodic Table.

The luminescent NSs, described herein may also further include ligands conjugated, cooperated, associated or attached to their surface. Suitable ligands may include any group known to those skilled in the art, including those disclosed in U.S. Pat. No. 8,283,412; U.S. Patent Publication No. 2008/0237540; U.S. Patent Publication No. 2010/0110728; U.S. Pat. No. 8,563,133; U.S. Pat. No. 7,645,397; U.S. Pat. No. 7,374,807; U.S. Pat. No. 6,949,206; U.S. Pat. No. 7,572,393; and U.S. Pat. No. 7,267,875, the disclosures of each of which are incorporated herein by reference. Use of such ligands may enhance the ability of the luminescent NSs to incorporate into various solvents and matrixes, including polymers. Increasing the miscibility (i.e., the ability to be mixed without separation) of the luminescent NSs in various solvents and matrixes may allow them to be distributed throughout a polymeric composition such that the NSs do not aggregate together and therefore do not scatter light. Such ligands are described as "miscibility-enhancing" ligands herein.

In certain embodiments, compositions having luminescent NSs distributed or embedded in a matrix material are provided. Suitable matrix materials may be any material known to the ordinarily skilled artisan, including polymetic materials, organic and inorganic oxides. Compositions described herein may be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting NSs (for example, as disclosed in U.S. Pat. No. 7,374,807) utilize the emission properties of luminescent nanostructures that are tailored to absorb light of a particular wavelength and then emit at a second wavelength, thereby providing enhanced performance and efficiency of active sources (e.g., LEDs).

While any method known to the ordinarily skilled artisan may be used to create luminescent NSs, a solution-phase colloidal method for controlled growth of inorganic nanomaterial phosphors may be used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," *J. Am. Chem. Soc.* 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," *J Am. Chem. Soc.* 115:8706 (1993), the disclosures of which are incorporated by reference herein in their entireties.

According to an embodiment, CdSe may be used as the NS material, in one example, for visible light down-conversion, due to the relative maturity of the synthesis of this material. Due to the use of a generic surface chemistry, it may also possible to substitute non-cadmium-containing NSs.

In semiconductor NSs, photo-induced emission arises from the band edge states of the NS. The band-edge emission from luminescent NSs competes with radiative and non-radiative decay channels originating from surface electronic states. X. Peng, et al., *J Am. Chem. Soc.* 30:7019-7029 (1997). As a result, the presence of surface defects such as dangling bonds provide non-radiative recombination centers and contribute to lowered emission efficiency. An efficient and permanent method to passivate and remove the surface trap states may be to epitaxially grow an inorganic shell material on the surface of the NS. X. Peng, et al., *J. Am. Chem. Soc.* 30:701 9-7029 (1997). The shell material may be chosen such that the electronic levels are type 1 with respect to the core material (e.g., with a larger bandgap to provide a potential step localizing the electron and hole to the core). As a result, the probability of non-radiative recombination may be reduced.

Core-shell structures may be obtained by adding organometallic precursors containing the shell materials to a reaction mixture containing the core NSs. In this case, rather than a nucleation event followed by growth, the cores act as the nuclei, and the shells may grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and to ensure solubility. A uniform and epitaxially grown shell may be obtained when there is a low lattice mismatch between the two materials.

Example materials for preparing core-shell luminescent NSs may include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTc, BeS, BcSe, BcTe, MgS, MgSe, GeS, GeSe, GeTe, SnS, SnSe, SnTe, PbO, PbS, Pb Se, PbTe, CuP, CuCl, CuBr, CuI, $Si_3N_4$, $Ge_3N_4$, $Al_2O_3$, $(Al, Ga, In)_2 (S, Se, Te)_3$, AlCO, and shell luminescent NSs for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

Luminescent NSs for use in the embodiments described herein may be less than about 100 nm in size, and down to less than about 2 nm in size and invention absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. Blue light may comprise light between about 435 nm and about 495 nm, green light may comprise light between about 495 nm and 570 nm and red light may comprise light between about 620 nm and about 750 nm in wavelength.

According to various embodiments, the luminescent NSs may have a size and a composition such that they absorb photons that are in the ultraviolet, near-infrared, and/or infrared spectra. The ultraviolet spectrum may comprise light between about 100 nm to about 400 nm, the near-infrared spectrum may comprise light between about 750 nm to about 100 μm in wavelength, and the infrared spectrum may comprise light between about 750 nm to about 300 μm in wavelength.

While luminescent NSs of other suitable material may be used in the various embodiments described herein, in certain embodiments, the NSs may be ZnS, InAs, CdSe, or any combination thereof to form a population of nanocrystals for use in the embodiments described herein. As discussed above, in further embodiments, the luminescent NSs may be core/shell nanocrystals, such as CdSe/ZnS, InP/ZnSe, CdSe/CdS or InP/ZnS.

Suitable luminescent nanostructures, methods of preparing luminescent nanostructures, including the addition of various solubility-enhancing ligands, can be found in Published U.S. Patent Publication No. 2012/0113672, the disclosure of which is incorporated by reference herein in its entirety.

It is to be understood that while certain embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments may be practiced otherwise than as specifically described.

What is claimed is:

1. A display device comprising:
    a backlight unit comprising a light source configured to emit a primary light in a first wavelength region of an electromagnetic (EM) spectrum; and
    a liquid crystal display (LCD) module comprising a pixel having:
        a first sub-pixel having a first emissive surface configured to emit a first light, having a first luminance, in a second wavelength region of the EM spectrum, wherein the first sub-pixel comprises a first phosphor film disposed on a substrate and a first filter element disposed on the first phosphor film;
        a second sub-pixel having a second emissive surface configured to emit a second light, having a second luminance, in a third wavelength region of the EM spectrum, wherein the first, second, and third wavelength regions are different from each other, wherein the second sub-pixel comprises a second phosphor film disposed on the substrate and a second filter element disposed on the second phosphor film, and wherein the first and second phosphor films are different regions of a continuous phosphor film and the first and second filter elements are different regions of a continuous filter element disposed on the continuous phosphor film; and
        a third sub-pixel having a third emissive surface configured to emit a third light, having a third luminance, in the first wavelength region of the EM spectrum, wherein the third luminance is greater than the first luminance and the second luminance, wherein the third sub-pixel comprises an optically transparent film disposed on the substrate, and wherein an area of the third emissive surface is smaller than an area of the first emissive surface and an area of the second emissive surface.

2. The display device of claim 1, wherein a ratio between the areas of the first, second, and third emissive surfaces ranges from about 2:2:1 to about 6:6:1.

3. The display device of claim 1, wherein a ratio between the areas of the first, second, and third emissive surfaces is about 4:4:1.

4. The display device of claim 1, wherein the areas of the first, second, and third emissive surfaces are different from each other.

5. The display device of claim 1, wherein the third light comprises a portion of the primary light.

6. The display device of claim 1, wherein:
the first phosphor film is configured to convert a first portion of the primary light to emit the first light; and
the first filter element is optically coupled to the first phosphor film and is configured to allow the first light to pass through the first filter element and to block an unconverted portion of the primary light from passing through the first filter element.

7. The display device of claim 6, wherein a surface of the first filter element comprises the first emissive surface.

8. The display device of claim 1, wherein:
the first phosphor film is configured to convert a first portion of the primary light to emit the first light; and
a surface of the first phosphor film comprises the first emissive surface.

9. The display device of claim 1, wherein:
the second phosphor film is configured to convert a second portion of the primary light to emit the second light; and
the second filter element is optically coupled to the second phosphor film and is configured to allow the second light to pass through the second filter element and to block an unconverted portion of the primary light from passing through the second filter element.

10. The display device of claim 9, wherein a surface of the second filter element comprises the second emissive surface.

11. The display device of claim 1, wherein:
the first and second phosphor films comprise first and second matrices, respectively; and
the first and second filter elements are embedded in the first and second matrices, respectively.

12. The display device of claim 1, wherein each of the first and second filter elements comprises scattering particles having titanium oxide, zinc oxide, zinc sulfide, silicone, or a combination thereof.

13. The display device of claim 1, wherein:
the first phosphor film comprises a first population of luminescent nanostructures configured to emit the first light in a wavelength region ranging from about 620 nm to about 750 nm; and
the second phosphor film comprises a second population of luminescent nanostructures configured to emit the second light in a wavelength region ranging from about 495 nm to about 570 nm.

14. The display device of claim 1, wherein:
the second phosphor film is configured to convert a second portion of the primary light to emit the second light; and
a surface of the second phosphor film comprises the second emissive surface.

15. The display device of claim 1, wherein the third sub-pixel excludes luminescent nanostructures.

16. The display device of claim 1, wherein the LCD module further comprises:
a first polarizing filter configured to polarize the primary light;
a liquid crystal solution layer configured to adjust an angle of polarization of the polarized primary light; and
a second polarizing filter, disposed between the liquid crystal solution layer and the first, second, and third sub-pixels, configured to control transmission of the polarized primary light from the liquid crystal solution layer to the first, second, and third sub-pixels.

17. The display device of claim 1, further comprising an optical cavity, wherein the light source is positioned within the optical cavity.

18. The display device of claim 1, further comprising a light guide plate, wherein the light source is externally coupled to the light guide plate.

19. A display device comprising:
a first sub-pixel having a first emissive surface configured to emit a first light, having a first luminance, in a first wavelength region of an electromagnetic (EM) spectrum, wherein the first sub-pixel comprises a first phosphor film disposed on a substrate and a first filter element disposed on the first phosphor film;
a second sub-pixel having a second emissive surface configured to emit a second light, having a second luminance, in a second wavelength region of the EM spectrum; and
a third sub-pixel having a third emissive surface configured to emit a third light, having a third luminance, in a third wavelength region of the EM spectrum, wherein the third luminance is greater than the first luminance and the second luminance, wherein the third sub-pixel comprises an optically transparent film disposed on the substrate and the optically transparent film comprises scattering particles, and wherein the first, second, and third wavelength regions are different from each other, and wherein an area of the third emissive surface is smaller than an area of the first emissive surface and an area of the second emissive surface.

20. The display device of claim 19, wherein:
the first sub-pixel further comprises a first light source configured to emit a first primary light in the third wavelength region;
the second sub-pixel further comprises a second light source configured to emit a second primary light in the third wavelength region; and
the third sub-pixel further comprises a third light source configured to emit a third primary light in the third wavelength region.

21. The display device of claim 20, wherein each of the first, second, and third light sources comprises an organic light emitting diode (OLED).

22. The display device of claim 19, wherein a ratio between the areas of the first, second, and third emissive surfaces ranges from about 2:2:1 to about 6:6:1.

23. The display device of claim 19, wherein a ratio between the areas of the first, second, and third emissive surfaces is about 4:4:1.

24. The display device of claim 19, wherein the areas of the first, second, and third emissive surfaces are different from each other.

25. The display device of claim 20, wherein the third light comprises a portion of the third primary light.

26. The display device of claim 20, wherein the first sub-pixel further comprises:
the first phosphor film configured to convert a portion of the first primary light to emit the first light; and
the first filter element, optically coupled to the first phosphor film, configured to allow the first light to pass through the first filter element and to block an unconverted portion of the first primary light from passing through the first filter element.

27. The display device of claim 26, wherein a surface of the first filter element comprises the first emissive surface.

28. The display device of claim 20, wherein:
the first sub-pixel further comprises a first phosphor film configured to convert a portion of the first primary light to emit the first light; and
a surface of the first phosphor film comprises the first emissive surface.

29. The display device of claim 20, wherein the second sub-pixel further comprises:
- a second phosphor film configured to convert a portion of the second primary light to emit the second light; and
- a second filter element, optically coupled to the second phosphor film, configured to allow the second light to pass through the second filter element and to block an unconverted portion of the second primary light from passing through the second filter element.

30. The display device of claim 29, wherein a surface of the second filter element comprises the second emissive surface.

31. The display device of claim 29, wherein:
- the first phosphor film comprises a first population of luminescent nanostructures configured to emit the first light in a wavelength region ranging from about 620 nm to about 750 nm; and
- the second phosphor film comprises a second population of luminescent nanostructures configured to emit the second light in a wavelength region ranging from about 495 nm to about 570 nm.

32. The display device of claim 20, wherein:
- the second sub-pixel further comprises a second phosphor film configured to convert a portion of the second primary light to emit the second light; and
- a surface of the second phosphor film comprises the second emissive surface.

33. The display device of claim 19, wherein the third sub-pixel excludes luminescent nanostructures.

34. A display device comprising:
- a first emissive surface configured to emit a first light, having a first luminance, in a first wavelength region of an electromagnetic (EM) spectrum;
- a second emissive surface configured to emit a second light, having a second luminance, in a second wavelength region of the EM spectrum; and
- a third emissive surface configured to emit a third light, having a third luminance, in a third wavelength region of the EM spectrum, wherein the third luminance is greater than the first luminance and the second luminance, wherein the first, second, and third wavelength regions are different from each other, wherein the first and second emissive surfaces are different regions of a continuous filter element, and wherein the areas of the first, second, and third emissive surfaces are different from each other.

35. The display device of claim 34, wherein a ratio between the areas of the first, second, and third emissive surfaces ranges from about 2:2:1 to about 6:6:1.

36. The display device of claim 34, wherein a ratio between the areas of the first, second, and third emissive surfaces is about 4:4:1.

37. The display device of claim 34, further comprising:
- a first phosphor film having a first surface that comprises the first emissive surface;
- a second phosphor film having a second surface that comprises the second emissive surface; and
- a third phosphor film having a third surface that comprises the third emissive surface.

38. The display device of claim 34, wherein the first, second, and third emissive surfaces are different regions of a pixel of the display device.

39. The display device of claim 34, further comprising a light source configured to emit a primary light in the third wavelength region.

40. The display device of claim 34, wherein:
- the first wavelength region ranges from about 620 nm to about 750 nm;
- the second wavelength region ranges from about 495 nm to about 570 nm ; and
- the third wavelength region ranges from about 435 nm to about 495 nm.

41. The display device of claim 34, further comprising:
- a first filter element having a first surface that comprises the first emissive surface;
- a second filter element having a second surface that comprises the second emissive surface; and
- a third filter element having a third surface that comprises the third emissive surface.

42. The display device of claim 41, wherein the first, second, and third filter elements are disposed on a same surface plane.

43. The display device of claim 37, wherein:
- the first phosphor film is configured to convert a first portion of a primary light to emit the first light;
- the second phosphor film is configured to convert a second portion of the primary light to emit the second light; and
- the third phosphor film is configured to convert a third portion of the primary light to emit the third light.

44. The display device of claim 37, wherein the first, second, and third phosphor films are disposed on a same surface plane.

* * * * *